(12) United States Patent
Huang et al.

(10) Patent No.: US 9,632,373 B2
(45) Date of Patent: Apr. 25, 2017

(54) DISPLAY PANEL AND MANUFACTURING METHOD OF DISPLAY PANEL

(71) Applicant: E Ink Holdings Inc., Hsinchu (TW)

(72) Inventors: Jiun-Ru Huang, Taoyuan County (TW); Kuo-Lung Fang, Taoyuan County (TW); Yu-Chi Chiu, Taoyuan County (TW); Yao-Jen Hsieh, Taoyuan County (TW)

(73) Assignee: E Ink Holdings Inc., Hsinchu (TW)

( * ) Notice: Subject to any disclaimer, the term of this patent is extended or adjusted under 35 U.S.C. 154(b) by 370 days.

(21) Appl. No.: 14/242,889

(22) Filed: Apr. 2, 2014

(65) Prior Publication Data

US 2014/0376164 A1 Dec. 25, 2014

(30) Foreign Application Priority Data

Jun. 21, 2013 (TW) .............................. 102122216 A (51) Int. Cl.
*G02F 1/1333* (2006.01)
*G02F 1/1345* (2006.01)
*H01L 51/52* (2006.01)

(52) U.S. Cl.
CPC .... *G02F 1/13452* (2013.01); *G02F 1/133351* (2013.01); *H01L 51/524* (2013.01); *H01L 51/5253* (2013.01); *G02F 2202/28* (2013.01)

(58) Field of Classification Search
CPC ........... G02F 1/13452; G02F 1/133351; H01L 51/524

(Continued)

(56) References Cited

U.S. PATENT DOCUMENTS

2002/0085158 A1* 7/2002 Armagost ........... G02F 1/13452
349/149
2004/0239850 A1* 12/2004 Kim .................. G02F 1/133632
349/117

(Continued)

FOREIGN PATENT DOCUMENTS

CN 1493173 4/2004
CN 101574758 11/2009

(Continued)

OTHER PUBLICATIONS

"Office Action of Taiwan Counterpart Application", issued on Apr. 23, 2015, p. 1-p. 9.

(Continued)

*Primary Examiner* — Lucy Chien
(74) *Attorney, Agent, or Firm* — Jianq Chyun IP Office (57) ABSTRACT

A display panel including a driving substrate, a display film, a first protection film, a first adhesion layer, and a sidewall structure is provided. The display film is disposed on the driving substrate. The first protection film is adhered on the display film through the first adhesion layer. The display film is located between the driving substrate and the first protection film. A material of the first adhesion layer is thermal melt-able. The sidewall structure is in contact with a side surface of the display film and includes the material of the first adhesion layer which is melted and re-solidified. In addition, a manufacture method of the display panel includes irradiating the driving substrate the first protection film and the first adhesion layer with a laser to form the sidewall structure in contact with the side surface of the display film.

19 Claims, 5 Drawing Sheets

(58) Field of Classification Search
USPC .......................................................... 349/58
See application file for complete search history.

(56) References Cited

U.S. PATENT DOCUMENTS

| | | | | |
|---|---|---|---|---|
| 2005/0239647 | A1* | 10/2005 | Caspar | B41M 5/265 |
| | | | | 503/201 |
| 2006/0138928 | A1* | 6/2006 | Kim | H01L 51/5253 |
| | | | | 313/400 |
| 2012/0099056 | A1* | 4/2012 | Lee | B23K 26/009 |
| | | | | 349/106 |
| 2013/0263488 | A1* | 10/2013 | Wu | G02B 6/0088 |
| | | | | 40/773 |

FOREIGN PATENT DOCUMENTS

| | | |
|---|---|---|
| CN | 101989019 | 3/2011 |
| CN | 102736296 | 10/2012 |
| CN | 102792413 | 11/2012 |
| TW | 576818 | 2/2004 |
| TW | 200412816 | 7/2004 |
| TW | 201002465 | 1/2010 |

OTHER PUBLICATIONS

"Office Action of China Counterpart Application", issued on Aug. 12, 2016, p. 1-p. 8.

* cited by examiner

DISPLAY PANEL AND MANUFACTURING METHOD OF DISPLAY PANEL

CROSS-REFERENCE TO RELATED APPLICATION

This application claims the priority benefit of Taiwan application serial no. 102122216, filed on Jun. 21, 2013. The entirety of the above-mentioned patent application is hereby incorporated by reference herein and made a part of this specification.

BACKGROUND OF THE INVENTION

Field of the Invention

The invention relates to a display panel and a manufacturing method thereof, and more particularly to a display panel protected by a protection film adhered outside and a manufacturing method thereof.

Description of Related Art

Since portable electronic products are popularized nowadays, the market has gradually called for attention to flexible displays (e.g. e-paper, e-books, and so on). One of manufacturing methods of flexible displays is to package a display medium having display functions to form a display film, and dispose the display film on a driving substrate to compose a display panel required, in which an electronic ink is one of the most common display mediums in the field.

Generally, intrusion of external moisture may cause negative influences to the electronic ink in the display film, thus the display panel of the flexible display is usually adhered with a protection film outside, so as to block external moisture. During process of adhering the protection film, although an upper surface of the display film can be covered by the protection film, it is possible for a side surface of the display film to expose to the outside.

Figure 1:
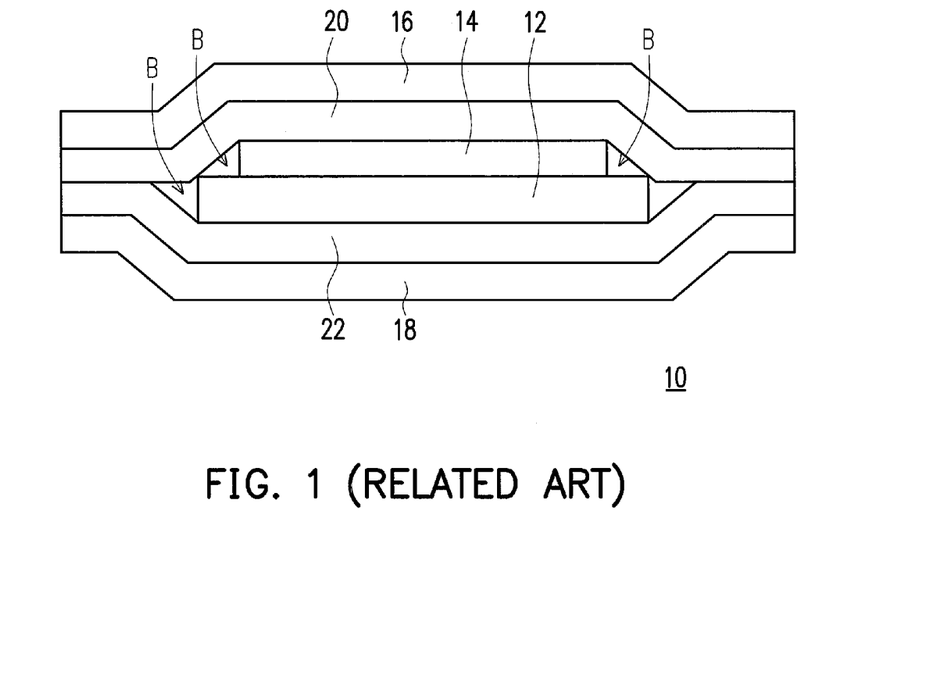
FIG. 1 is a schematic diagram of a conventional display panel.

In order to solve above-said problem, an adhering method is introduced, which adopts a protection film having an area greater than an area of the driving substrate, as shown in FIG. 1. In FIG. 1, a display panel 10 includes a driving substrate 12, a display film 14, protection films 16 and 18, and adhesion layers 20 and 22. The adhesion layer 20 is utilized to adhere the protection film 16 on the display film 14, and the adhesion layer 22 is utilized to adhere the protection film 18 on the driving substrate 12. Areas of the protection films 16 and 18 are greater than the driving substrate 12. In this case, the protection film 16 is bended from the an upper surface of the display film 14 to a side surface, and the protection film 18 is bended from a lower surface of the driving substrate 12 to a side surface, such that the protection films 16 and 18 cover on the side surfaces of the display film 14 and the driving substrate 12, so as to achieve a purpose of blocking external moisture.

However, bended portions of the protection films 16 and 18 cannot conform to corners of the display film 14 and the driving substrate 12. Therefore, the bubbles B being present at edges of the display film 14 and the driving substrate 12 may still be subject to influences of external moisture. Moreover, the bubbles B can have a volume variation due to changes of external temperature (such as thermal expansion or thermal contraction), which may cause the protection films 16 and 18 to separate, such that protection against external moisture (which is provided by the protection films 16 and 18) for sidewalls of the display film 14 and the driving substrate 12 may be reduced. Accordingly, a proper protection for the display film still cannot be effectively achieved by using such adhering method.

SUMMARY OF THE INVENTION

The invention provides a display panel having an ideal quality.

The invention provides a manufacturing method of display panel, utilized for manufacturing the display panel having the ideal quality.

A display panel of the invention includes a driving substrate, a display film, a first protection film, a first adhesion layer, and a sidewall structure. The display film is disposed on the driving substrate. The first protection film is adhered on the display film through the first adhesion layer. The display film is located between the driving substrate and the first protection film. A material of the first adhesion layer is thermal melt-able. The sidewall structure is in contact with a side surface of the display film and includes the material of the first adhesion layer which is melted and re-solidified.

In an embodiment of the invention, the sidewall structure further includes a material of the first protection film being melted and re-solidified.

In an embodiment of the invention, the driving substrate includes a carrier board and a driving device layer, in which the driving device layer is located between the carrier board and the display film. In this case, the sidewall structure can further include a material of the carrier board being melted and re-solidified.

In an embodiment of the invention, the display panel further includes a second protection film. The second protection film is adhered on the driving substrate through a second adhesion layer, and the driving substrate and the display film are sandwiched between the first protection film and the second protection film. In this case, the sidewall structure can further include a material of the second adhesion layer being melted and re-solidified. Furthermore, the sidewall structure can further include a material of the second protection film being melted and re-solidified. Herein, the second protection film includes, for example, a carrier layer and at least one coating layer coated on the carrier layer.

In an embodiment of the invention, the first protection film includes a carrier layer and at least one coating layer coated on the carrier layer.

In an embodiment of the invention, the sidewall structure partially surrounds the display film.

In an embodiment of the invention, the sidewall structure completely surrounds the display film and has a close ring pattern.

In an embodiment of the invention, the display panel further includes a circuit board. The circuit board is connected to a bonding area of the driving substrate, and the sidewall structure is not in the boding area.

A manufacturing method of display panel according to the invention includes at least the following steps. A display film is disposed on a driving substrate, in which the driving substrate has a peripheral area located outside the display film. A first protection film is adhered on the display film by using a first adhesion layer, the display film is located between the driving substrate and the first protection film, in which the first adhesion layer is in contact with the display film and the peripheral area of the driving substrate. The peripheral area of the driving substrate is irradiated with a laser along a path so as to melt the first adhesion layer and cut the driving substrate, in which the path surrounds the display film, and a material of the first adhesion layer being melted is re-solidified at a side surface of the display film, so as to compose a sidewall structure in contact with the side surface of the display film.

In an embodiment of the invention, a second protection film is further adhered on the driving substrate through a second adhesion layer, and the driving substrate and the display film are sandwiched between the first protection film and the second protection film. In this case, the laser further melts the second adhesion layer, and the sidewall structure further includes a material of the second adhesion layer being melted and re-solidified. The laser passes through the first protection film, the first adhesion layer, the driving substrate, the second adhesion layer and the second protection film, with a power of the laser being approximately 3.75 to 4.75 W.

In an embodiment of the invention, the driving substrate includes a carrier board and a driving device layer. The driving device layer is located between the carrier board and the display film, and the laser further melts the carrier board. In this case, the sidewall structure further includes a material of the carrier board being melted and re-solidified.

In an embodiment of the invention, a circuit board is further bonded on the driving substrate, in which the peripheral area of the driving substrate includes a bonding area in which the circuit board is bonded on the bonding area and the path of the laser does not pass the bonding area.

In an embodiment of the invention, the path completely surrounds the display film so that the sidewall structure has a close ring pattern surrounding the display film.

Based on above, by irradiating the protection films, the adhesion layers and the driving substrate with the laser in manufacturing process of the display panel, at least one of the adhesion layers is melted and re-solidified at the side surface of the display film. The material being melted and re-solidified is capable of providing protection which prevents external moisture from being intruded into the display film, so as to extend lifetime of the display panel. In addition, besides melting the adhesion layer, irradiation of the laser can also optionally melt the protection films or even the carrier board of the driving substrate, such that the sidewall structure can be composed by multiple materials, so to provide an ideal protection to the display film.

To make the above features and advantages of the disclosure more comprehensible, several embodiments accompanied with drawings are described in detail as follows.

DESCRIPTION OF THE EMBODIMENTS

Figure 2A:
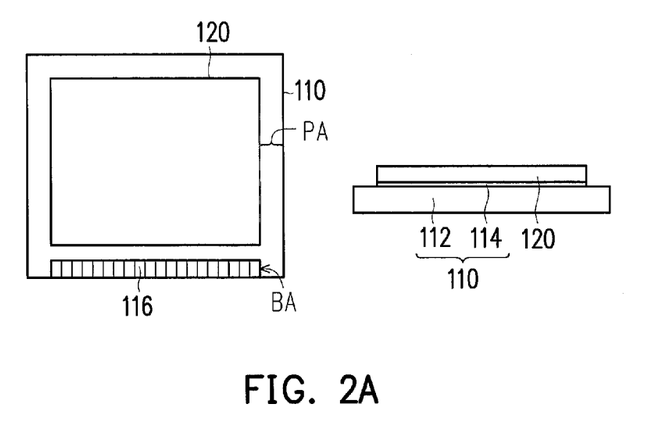
FIGS. 2A to 2C are schematic diagrams illustrating a manufacturing process of a display panel according to an embodiment of the invention.
Figure 2B:
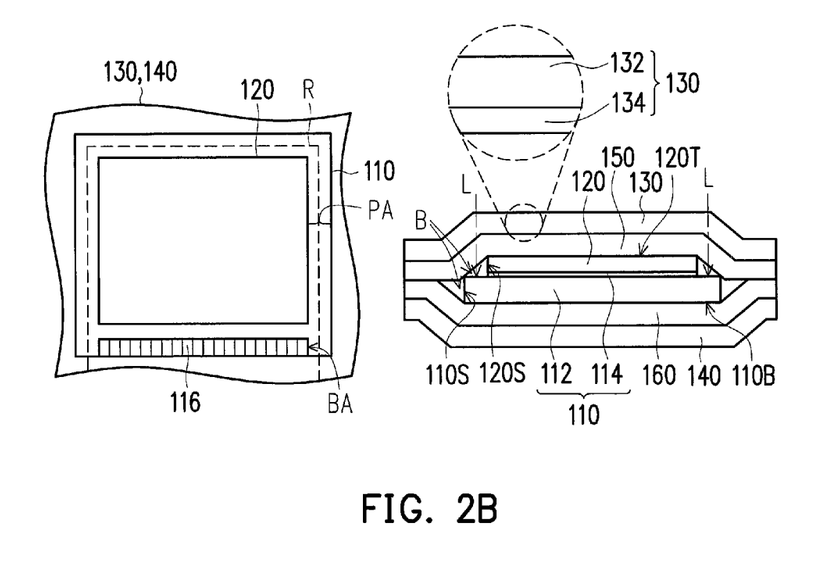
Figure 2C:
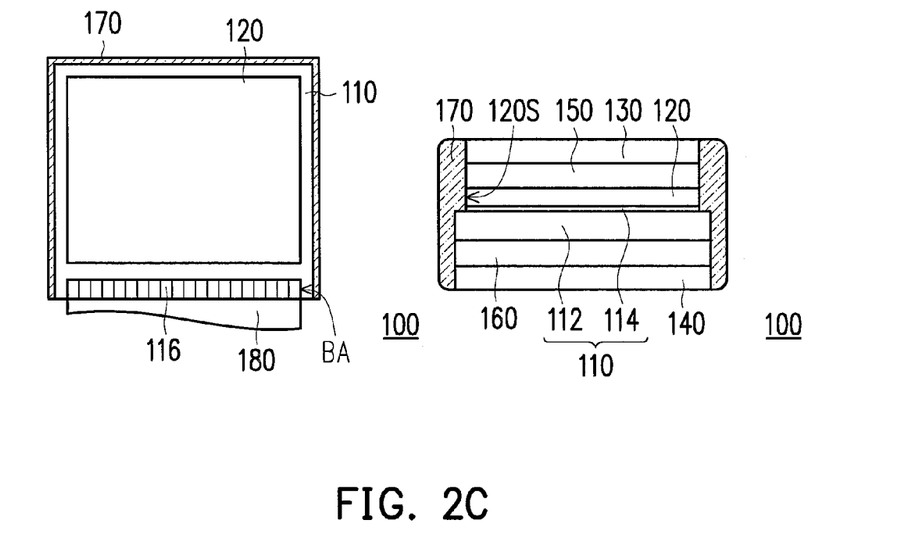

FIGS. 2A to 2C are a manufacturing process of a display panel according to an embodiment of the invention. Referring to FIG. 2A, first, a display film 120 is disposed on a driving substrate 110. In the present embodiment, the driving substrate 110 includes a carrier board 112 and a driving device layer 114, and the display film 120 is disposed on the driving device layer 114. Thus, the driving device layer 114 is located between the display film 120 and the carrier board 112. Further, the display film 120 can be a microcapsule electronic ink layer, a microcup electronic ink layer, a quick response liquid powder display (QR-LPD) electronic ink layer, or even a cholesteric liquid crystal (CHLC) layer. The driving device layer 114 can drive the electronic ink packaged in the display film 120, so as to achieve a display effect.

It can known from FIG. 2A that, an area of the display film 120 is less than an area of the driving substrate 110. Thus, when the display film 120 is disposed on the driving substrate 110, a partial area of the driving substrate 110 is exposed without covered by the display film 120, and such area can be defined, for example, as a peripheral area PA. Substantially, the peripheral area PA completely surrounds the display film 120 and includes a bonding area BA. A plurality of pins 116 is disposed in the bonding area BA, and the pins 116 are configured to connect with a circuit board. In other words, the pins 116 are electronically connected to the driving device layer 114, disposed on the carrier board 112 and located in the bonding area BA. However, the invention is not limited thereto. For instance, the driving substrate being bonded to the circuit board can input or output signals through a wireless transmission method in which a wireless transmission module, such as a near field communication (NFC) or a wireless LAN (WLAN) module, is used. This means that it is not required for the driving substrate 110 to be disposed with the pins 116 and the corresponding bonding area BA.

Subsequently, referring to FIG. 2B, a first protection film 130 and a second protection film 140 are adhered on the display film 120 and the driving substrate 110, respectively. Herein, the first protection film 130 can be adhered on the display film 120 through a first adhesion layer 150, and the second protection film 140 can be adhered on the driving substrate 110 through a second adhesion layer 160. The first protection film 130 and the second protection film 140 can respectively be a multi-layer film. For instance, the first protection Film 130 can be composed by a carrier layer 132 and a coating layer 134 coated on the carrier layer 132, in which a material of the carrier layer 132 can be polyethylene terephthalate (PET), and a material of the coating layer 134 can be aluminium oxide, but the invention is not limited thereto. In other embodiments, the first protection film 132 can include multiple layers of the coating layer 134, and the materials of the multiple layers of the coating layer 134 are not limited only to aluminium oxide. In addition, the second protection layer 140 can be composed by the carrier layer and at least one coating layer all the same.

In the present embodiment, areas of the first protection film 130 and the second protection film 140 are both greater than the area of the driving substrate 110. Therefore, the first protection film 130 is bended from an upper surface 120T of the display film 120 towards a side surface 120S, and the first adhesion layer layer 150 is in contact with the upper surface 120T of the display film 120 and the peripheral area PA of the driving substrate 110. Meanwhile, the second protection film 140 is bended from a lower surface 110B of the driving substrate 110 towards a side surface 110S. Accordingly, the first adhesion layer 150 and the second adhesion layer 160 can be in contact with each other. However, a bubble B is formed at periphery of the display film 120. Similarly, another bubble B is also formed at periphery of the driving substrate 110.

In the present embodiment, materials of the first adhesion layer 150 and the second adhesion layer 160 can be, for example, thermal melt-able. Accordingly, in order to solve the problem caused by existence of the bubbles B, in the present embodiment, the peripheral area PA is irradiated with a laser L along a path R, so that the first adhesion layer 150 and the second adhesion layer 160 is heated and melted to fill up the bubble B. Herein, due to irradiation by the laser L, the driving substrate 110, the first protection film 130 and the second protection film 140 are all cut. Thus, referring to FIG. 2C, after the irradiation by the laser L, the first adhesion layer 150 and the second adhesion layer 160 being melted are then re-solidified at the side surface 120S of the display film 120 to compose a sidewall structure 170. Moreover, the driving substrate 110, the first protection film 130 and the second protection film 140 are all cut into areas as defined by the path R in FIG. 2B.

More specifically, the laser L passes through the first protection film 130, the first adhesion layer 150, the driving substrate 110, the second adhesion layer 160 and the second protection film 140. In this case, besides cutting action, the laser L further melts at least the first adhesion layer 150 and the second adhesion layer 160, with a power of the laser L being approximately 3.75 to 4.75 W. This allows the adhesion layers 150 and 160 to be melted instead of being burnt out and the protection films 130 and 140 to be effectively cut off. Thus, the sidewall structure 170 is composed of materials of the first adhesion layer 150 and the second adhesion layer 160 being melted and re-solidified, but the invention is not limited thereto. For instance, the carrier board 112 of the driving substrate 110, the first protection film 130 and the second protection film 140 may also be melted due to the irradiation of the laser L. Thus, the sidewall structure 170 can further include a material of at least one among the carrier board 112, the first protection film 130 and the second protection film 140 being melted and re-solidified. In other words, the sidewall structure 170 is substantially of a mixed material.

Since said materials all have a fluidity after being melted, the bubbles B depicted in FIG. 2B can be filled up by said materials being melted. Accordingly, the sidewall structure 170 formed by the materials being melted and re-solidified can be in contact with the side surface 120S of the display film 120, so to completely cover the display film 120. Further, in the present embodiment, a circuit board 180 can be optionally bonded to the pins 116 in the bonding area BA, so as to complete the manufacturing process of a display panel 100. At this time, the display panel 100 includes the driving substrate 110, the display film 120, the first protection film 130, the second protection film 140, the first adhesion layer 150, the second adhesion layer 160, the sidewall structure 170 and the circuit board 180.

It can be known from above manufacturing process that, the display film 120 is disposed on the driving substrate 110, and the driving substrate 110 and the display film 120 are both sandwiched between the first protection film 130 and the second protection film 140. The first protection film 130 and the second protection film 140 are adhered on the display film 120 and the driving substrate 110, respectively, through the first adhesion layer 150 and the second adhesion layer 160. The sidewall structure 170 is at least composed by the first adhesion layer 150 and the second adhesion layer 160 being melted and re-solidified, and the sidewall structure 170 is in contact with the side surface 120S of the display film 120. Accordingly, external moisture cannot be easily intruded into the display film 120 from the side surface 120S, so as to facilitate in extending lifetime of the display panel 100.

Figure 3:
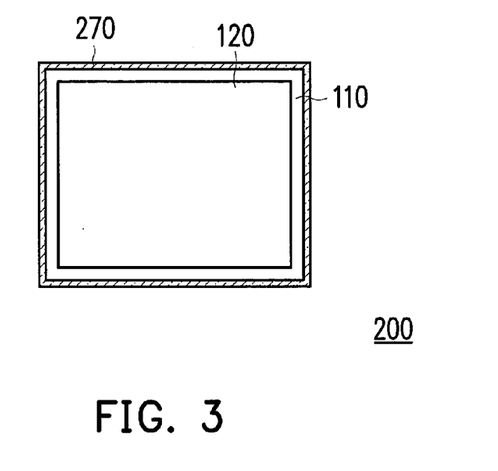
FIG. 3 is a schematic diagram of a display panel according to another embodiment of the invention.

Further, in order to be bonded with the circuit board 180, according to FIG. 2B, the bonding area BA of the driving substrate 110 is not cut by the laser L, which means that the path R does not pass the bonding area BA. Therefore, the sidewall structure 170 composed by the irradiation by the laser L is neither extended into the bonding area BA, nor crossed the bonding area BA, so that the sidewall structure 170 is substantially of a U-shaped pattern. However, the invention is not limited thereto. Referring to FIG. 3, FIG. 3 is a top view of a display panel according to another embodiment of the invention. In the embodiment of FIG. 3, a display panel 200 is substantially identical to the display panel 100, thus the same elements shown in the two embodiments are referred to the same reference number. More specifically, in the display panel 200, it is not required for the driving substrate 100 to be connected with the circuit board. Thus, the display panel 200 does not include the bonding area BA depicted in FIG. 2C. In this case, a sidewall structure 270 can have a fully-close ring pattern. In other words, the sidewall structure 270 completely surrounds the display film 120.

Figure 4A:
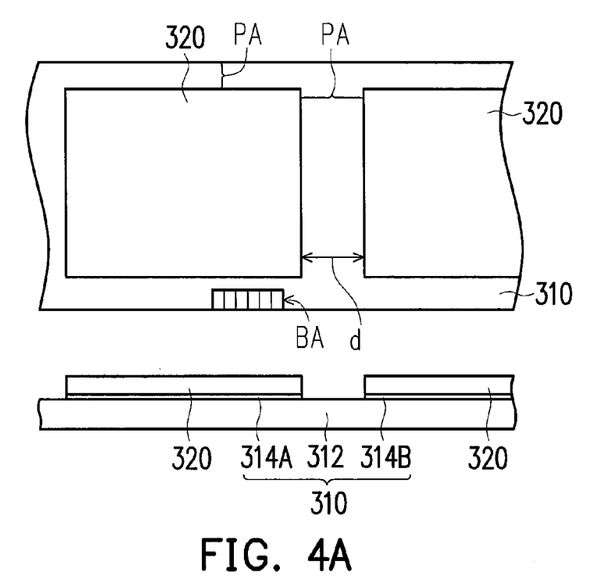
FIGS. 4A to 4C are schematic diagrams illustrating a manufacturing process of a display panel according to another embodiment of the invention.
Figure 4B:
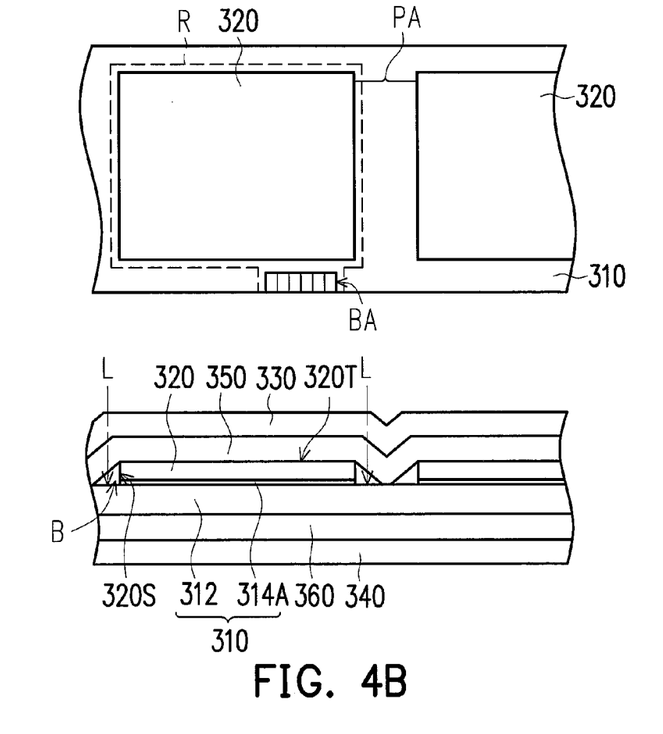
Figure 4C:
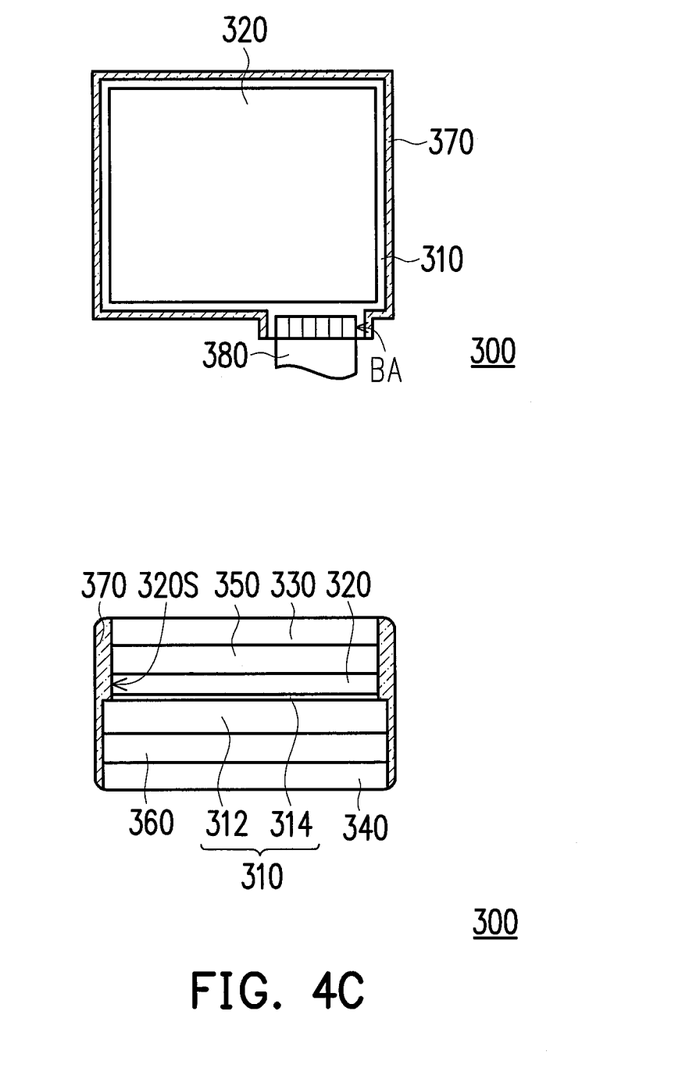

In the foregoing embodiments, the manufacturing process of the display panel is disclosed in a manner of disposing one single display film on one single driving substrate, but the invention is not limited thereto. FIGS. 4A to 4C are a manufacturing process of a display panel according to another embodiment of the invention. Referring to FIG. 4A, a plurality of display film 320 is disposed on a driving substrate 310. In this case, the driving substrate 310 can be, for example, utilized to manufacture a plurality of display panels. Accordingly, the plurality of display films 320 are disposed on the driving substrate 310, and a distance between each of the display films 320 can be regarded as the peripheral area PA of the driving substrate 310 corresponding to each of the display panels. Further, the bonding area BA is configured in the peripheral area PA corresponding to each of the display panels, for example. Moreover, in the present embodiment, the driving substrate 310 includes a carrier board 312 and a plurality of driving device layers 314A and 314B. Each of the driving device layers 314A and 314B is disposed between a corresponding one of the display films 320 and the carrier board 312. The manufacturing process according to the present embodiment of the invention is described with reference to components corresponding to the driving device layer 314A.

Subsequently, referring to FIG. 4B, a first protection film 330 and a second protection film 340 are adhered on the display film 320 and the driving substrate 310, respectively, through a first adhesion layer 350 and a second adhesion layer 360. In this case, since the carrier board 312 of the driving substrate 310 is of a continuous plate-shaped object, the first adhesion layer 350 and the second adhesion layer 360 are not extended to a side surface of the carrier board 312. In other words, the first adhesion layer 350 and the second adhesion layer 360 are spaced apart by at least the carrier board 312.

Further, in the present embodiment, the first protection film 330 and the first adhesion layer 350 are bended from an upper surface 320T of the display film 320 towards a side surface 320S. At this time, the bubble B can be formed at periphery of the display film 320. Thus, as the same to the foregoing embodiments, the peripheral area PA is irradiated with the laser L along the path R in the present embodiment. Since a material of the first adhesion layer 350 is melt-able, the irradiation of the laser L can melt the first adhesion layer 350 and the melted material can fill into the bubble. Further, energy of the laser L is capable of cutting the first protection film 330, the carrier board 312 and the second protection film 340. Thus, after the laser irradiation is performed, as shown in FIG. 4C, the driving substrate 310 is cut into a desired size, and the display film 320 is surrounded by a sidewall structure 370, in which the sidewall structure 370 is composed by at least a material of the first adhesion layer 350 being melted and re-solidified.

Since the sidewall structure 370 is formed by the cutting step with the laser L as depicted in FIG. 4B, the path R for the irradiation of the laser L has roughly decided an outline of the sidewall structure 370. Referring to the present embodiment in which the path R does not cross the bonding area BA, the sidewall structure 370 is not present in the bonding area BA but only partially surrounding the display film 320. Referring to FIG. 4C, the bonding area BA is not cut by the laser L, thus in the present embodiment, a circuit board 380 is further bonded to the bonding area BA so as to complete the manufacturing process of the display panel 300.

The display panel 300 includes the driving substrate 310 having a driving device layer 314 on the carrier board 312, the display film 320, the first protection film 330, the second protection film 340, the first adhesion layer 350, the second adhesion layer 360, the sidewall structure 370 and the circuit board 380. In the present embodiment, the sidewall structure 370 is in contact with a side surface 320S of the display film 320 to block the intrusion of external moisture, which facilitates in preventing the display film 320 from the intrusion of external moisture and extending lifetime of the display panel 300.

As similar to the foregoing embodiments, the irradiation of the laser L melts not only the first adhesion layer 350, but also the carrier board 312, the first protection film 330, the second adhesion layer 360 and the second protection film 340. Thus, the sidewall structure 370 can also be composed of a mixed material. In other words, besides the material of the first adhesion layer 350 being melted and re-solidified, the sidewall structure 370 can further include materials of any one or multiple ones among the carrier board 312, the first protection film 330, the second adhesion layer 360 and the second protection film 340 being melted and re-solidified.

In summary, the display panel according to the embodiments of the invention can be cut into the desired size with the step of irradiating with the laser, and energy of the laser can also be utilized to partially melt of the materials of the adhesion layers or the protection films. The materials are melted and re-solidified to form the sidewall structure on the side surface of the display panel, which is in contact with the side surface of the display film. Accordingly, external moisture cannot be easily intruded into the display film due to blocking of the sidewall structure, so as to reduce possibility of the display film being damaged. Hence, an ideal lifetime of the display panel according to the embodiment of the invention can be ensured.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A display panel, comprising:
a driving substrate,
a display film disposed on the driving substrate;
a first protection film adhered on the display film through a first adhesion layer, and the display film being located between the driving substrate and the first protection film, wherein a material of the first adhesion layer is thermal melt-able; and
a sidewall structure in contact with a side surface of the display film and including the material of the first adhesion layer being melted and re-solidified.

2. The display panel as recited in claim 1, wherein the sidewall structure further comprises a material of the first protection film being melted and re-solidified.

3. The display panel as recited in claim 1, wherein the driving substrate comprises a carrier board and a driving device layer, the driving device layer being located between the carrier board and the display film.

4. The display panel as recited in claim 3, wherein the sidewall structure further comprises a material of the carrier board being melted and re-solidified.

5. The display panel as recited in claim 1, further comprises a second protection film adhered on the driving substrate through a second adhesion layer, and the driving substrate and the display film being sandwiched between the first protection film and the second protection film.

6. The display panel as recited in claim 5, wherein the sidewall structure further comprises a material of the second adhesion layer being melted and re-solidified.

7. The display panel as recited in claim 5, wherein the sidewall structure further comprises a material of the second protection film being melted and re-solidified.

8. The display panel as recited in claim 5, wherein the second protection film comprises a carrier layer and at least one coating layer coated on the carrier layer.

9. The display panel as recited in claim 1, wherein the first protection film comprises a carrier layer and at least one coating layer coated on the carrier layer.

10. The display panel as recited in claim 1, wherein the sidewall structure partially surrounds the display film.

11. The display panel as recited in claim 1, wherein the sidewall structure completely surrounds the display film and has a close ring pattern.

12. The display panel as recited in claim 1, further comprising a circuit board connected to a bonding area of the driving substrate, and the sidewall structure being not in the boding area.

13. A manufacturing method of display panel, comprising:
disposing a display film on a driving substrate, wherein the driving substrate has a peripheral area located outside the display film;
adhering a first protection film on the display film by using a first adhesion layer, the display film being located between the driving substrate and the first protection film, wherein the first adhesion layer is in contact with the display film and the peripheral area; and
irradiating the peripheral area of the driving substrate with a laser along a path so as to melt the first adhesion layer and cut the driving substrate, wherein the path surrounds the display film, and a material of the first adhesion layer being melted is re-solidified at a side surface of the display film, so as to compose a sidewall structure in contact with the side surface of the display film.

14. The manufacturing method of display panel as recited in claim 13, further comprising adhering a second protection film on the driving substrate through a second adhesion layer, and the driving substrate and the display film being sandwiched between the first protection film and the second protection film.

15. The manufacturing method of display panel as recited in claim 14, wherein the laser further melts the second adhesion layer, and the sidewall structure further comprises a material of the second adhesion layer being melted and re-solidified.

16. The manufacturing method of display panel as recited in claim 14, wherein the laser passes through the first protection film, the first adhesion layer, the driving substrate, the second adhesion layer and the second protection film, with a power of the laser being 3.75 to 4.75 W.

17. The manufacturing method of display panel as recited in claim 13, wherein the driving substrate comprises a carrier board and a driving device layer, the driving device layer is located between the carrier board and the display film, the laser further melts the carrier board, and the sidewall structure further comprises a material of the carrier board being melted and re-solidified.

18. The manufacturing method of display panel as recited in claim 13, further comprises bonding a circuit board on the driving substrate, wherein the peripheral area of the driving substrate includes a bonding area in which the circuit board is bonded on the bonding area and the path does not pass the bonding area.

19. The manufacturing method of display panel as recited in claim 13, wherein the path completely surrounds the display film so that the sidewall structure has a close ring pattern surrounding the display film.

\* \* \* \* \*